United States Patent [19]

Iwasaki

[11] Patent Number: 5,192,701
[45] Date of Patent: Mar. 9, 1993

[54] METHOD OF MANUFACTURING FIELD EFFECT TRANSISTORS HAVING DIFFERENT THRESHOLD VOLTAGES

[75] Inventor: Hiroshi Iwasaki, Yokohama, Japan
[73] Assignee: Kabushiki Kaisha Toshiba, Kawasaki, Japan
[21] Appl. No.: 609,010
[22] Filed: Oct. 31, 1990

Related U.S. Application Data

[62] Division of Ser. No. 323,697, Mar. 15, 1989, abandoned.

[30] Foreign Application Priority Data

Mar. 17, 1988 [JP] Japan .................. 63-64041

[51] Int. Cl.⁵ .................. H01L 21/20; H01L 21/335
[52] U.S. Cl. .................. 437/41; 437/45; 437/56; 437/89; 437/107
[58] Field of Search .................. 437/912, 133, 41, 45, 437/56, 89, 90, 107, 40; 357/23.12; 148/DIG. 126

[56] References Cited

U.S. PATENT DOCUMENTS

| | | | |
|---|---|---|---|
| 3,909,320 | 9/1975 | Gauge et al. | 148/187 |
| 4,328,510 | 5/1982 | Rao | 357/41 |
| 4,614,564 | 9/1986 | Sheldon et al. | 437/90 |
| 4,635,343 | 1/1987 | Kuroda | 437/133 |
| 4,689,115 | 8/1987 | Ibbotson et al. | 437/905 |
| 4,732,870 | 3/1988 | Mimura | 437/40 |
| 4,849,368 | 7/1989 | Yamashita et al. | 437/133 |
| 4,902,643 | 2/1990 | Shimawaki | 437/89 |
| 4,921,814 | 5/1990 | Ishikawa et al. | 437/47 |
| 4,948,751 | 8/1990 | Okamoto et al. | 437/107 |
| 5,026,655 | 6/1991 | Ohata | 437/40 |
| 5,041,393 | 8/1981 | Ahrens et al. | 437/58 |
| 5,051,372 | 9/1991 | Sasaki | 437/89 |

FOREIGN PATENT DOCUMENTS

| | | |
|---|---|---|
| 0112657 | 7/1984 | European Pat. Off. . |
| 0135307 | 3/1985 | European Pat. Off. . |
| 0244840 | 11/1987 | European Pat. Off. . |
| 59-61059 | 4/1984 | Japan . |
| 59-112659 | 6/1984 | Japan . |
| 60-101972 | 6/1985 | Japan . |
| 61-99379 | 5/1986 | Japan . |

OTHER PUBLICATIONS

Sze, *Semiconductor Devices*, pp. 193 & 492, 1985.
Muller & Kamins, Device Electronics for Integrated Circuits, 1986, pp. 447, 505-510.
Abe, M., et al. "New Technology Towards GaAs...", IEEE Trans. Elec. Dev., vol. ED-29, No. 7, Jul. 1987, pp. 1088-1094.
Patent Abstracts of Japan, vol. 8, No. 161 (E-257) (1598) Jul. 27, 1986 & JP-A-5961059.
Patent Abstracts of Japan, vol. 8, No. 231 (E-274) (1688) Oct. 24, 1984 & JP-A-59112659.
Patent Abstracts of Japan, vol. 10, No. 251 (E-348) (1974) Oct. 8, 1984 & JP-A-60101972.
Patent Abstracts of Japan, vol. 10, No. 279 (E-439) (2355) Dec. 20, 1986 & JP-A-6199379.
Patent Abstracts of Japna, vol. 10, No. 376 (E-464) (2433) Dec. 20, 1986 & JP-A-6199379.

*Primary Examiner*—T. N. Quach
*Attorney, Agent, or Firm*—Finnegan, Henderson, Farabow, Garrett and Dunner

[57] ABSTRACT

A semiconductor device which comprises a semi-insulating substrate and a plurality of field effect transistors (FETs) formed on the semi-insulating substrate. An epitaxial layer of one conductivity type is formed on the semi-insulating substrate by a crystal growth technique which is capable of controlling a film thickness at an atomic level. At least some of channel active layers of the FETs have different threshold voltages one another due to a difference in thickness of the epitaxial layer and/or due to an additional ion implantation region selectively formed in the epitaxial layer. A manufacturing method of the semiconductor device is also disclosed, wherein a portion of the epitaxial layer corresponding to the channel active layer of a FET is thickened by the repetition of an epitaxial growth, thinned by the etching of the epitaxial layer or ion implanted thereby obtaining a different threshold voltage from that of another FET.

2 Claims, 6 Drawing Sheets

METHOD OF MANUFACTURING FIELD EFFECT TRANSISTORS HAVING DIFFERENT THRESHOLD VOLTAGES

This application is a division of application Ser. No. 07/323,697, filed Mar. 15, 1989, abandoned.

BACKGROUND OF THE INVENTION

1. Field of the Invention

The present invention relates to a semiconductor device and a method of manufacturing the same and, more particularly, to a MESFET (Metal Semiconductor Field Effect Transistor) and a method of manufacturing the same.

2. Description of the Related Art

A GaAs MESFET as a typical MESFET has already been proposed by the present inventor in Japanese Patent Application No. 61-104693 wherein an epitaxial active layer is obtained by controlling and depositing a channel active layer region of the GaAs MESFET at an atomic layer level.

A MESFET using the above epitaxial active layer can be manufactured as a MESFET having a uniform threshold voltage. However, an application of such a MESFET to an integrated circuit in which MESFETs having different threshold voltages are formed on a single substrate is not considered at all in Japanese Patent Application No. 61-104693.

SUMMARY OF THE INVENTION

It is an object of the present invention to provide a semiconductor device capable of being applied to an integrated circuit in which MESFETs having different threshold voltages can be formed on a single substrate, and a method of manufacturing the same.

In order to achieve the above object according to the present invention, there is provided a semiconductor device comprising:

a semi-insulating substrate;

a plurality of field effect transistors (FETs) formed on the semi-insulating substrate, wherein at least some of channel active layers of said field effect transistors have different threshold voltages due to a difference in a thickness of epitaxial layers formed on said semi-insulating substrate and/or due to an additional ion implantation region selectively formed in said epitaxial layers.

According to the present invention, there is provided a method of manufacturing a semiconductor device, comprising the steps of: forming epitaxial layers of a first conductivity type on a semi-insulating substrate by a crystal growth technique which is capable of controlling a film thickness at an atomic level, at least two channel active layers being formed in said epitaxial layers; and further depositing epitaxial layers of the first conductivity type including a portion to serve as a channel active layer on at least one of the channel active layers by a crystal growth technique which is capable of controlling a film thickness at an atomic level.

According to the present invention, there is provided a method of manufacturing a semiconductor device, comprising the steps of: forming epitaxial layers of a first conductivity type on a semi-insulating substrate by a crystal growth technique which is capable of controlling a film thickness at an atomic level, at least two channel active layers being formed in said epitaxial layers; and etching a portion of said epitaxial layers corresponding to at least one of said channel active layers to form a recess in said epitaxial layers.

According to the present invention, there is provided a method of manufacturing a semiconductor device, comprising the steps of: forming epitaxial layers of a first conductivity type on a semi-insulating substrate by a crystal growth technique which is capable of controlling a film thickness at an atomic level, at least two channel active layers being formed in said epitaxial layers; and selectively performing ion implantation in at least one portion of said epitaxial layers to serve as said channel active layer to form at least one kind of channel active layer region.

According to the present invention, there is provided a method of manufacturing a field effect transistor, comprising the steps of:

forming epitaxial layers of a first conductivity type on a semi-insulating substrate by a crystal growth technique which is capable of controlling a film thickness at an atomic level, at least two channel active layers being formed in said epitaxial layers;

further depositing epitaxial layers of said first conductivity type including a portion to serve as a channel active layer on at least one of the channel active layers by a crystal growth technique which is capable of controlling a film thickness at an atomic level;

forming an element isolation trench between the channel active layers adjacent to each other;

selectively forming gate electrodes on the channel active layers; and performing ion implantation using the gate electrodes as masks to form source/drain regions.

According to the present invention, there is provided a method of manufacturing a field effect transistor, comprising the steps of:

forming epitaxial layers of a first conductivity type on a semi-insulating substrate by a crystal growth technique which is capable of controlling a film thickness at an atomic level, at least two channel active layers being formed in said epitaxial layers;

etching a portion of said epitaxial layers corresponding to at least one of said channel active layers to form a recess in said epitaxial layers;

forming an element isolation trench between the channel active layers adjacent to each other;

selectively forming gate electrodes on the channel active layers; and performing ion implantation using the gate electrodes as masks to form source/drain regions.

According to the present invention, there is provided a method of manufacturing a field effect transistor, comprising the steps of:

forming epitaxial layers of a first conductivity type on a semi-insulating substrate by a crystal growth technique which is capable of controlling a film thickness at an atomic level, at least two channel active layers being formed in said epitaxial layers;

selectively performing ion implantation in at least one portion of said epitaxial layers to serve as said channel active layer to form at least one kind of channel active layer region;

forming an element isolation trench between the channel active layers adjacent to each other;

selectively forming gate electrodes on the channel active layers; and performing ion implantation using the gate electrodes as masks to form source/drain regions.

According to the present invention, there is provided a method of manufacturing a field effect transistor, comprising the steps of:

forming epitaxial layers of a first conductivity type on a semi-insulating substrate by a crystal growth technique which is capable of controlling a film thickness at an atomic level, at least two channel active layers being formed in said epitaxial layers;

selectively performing ion implantation in at least one portion of said epitaxial layers to serve as said channel active layer to form at least one kind of channel active layer region;

forming an element isolation trench between the channel active layers adjacent to each other;

forming a first metal film on an entire upper surface;

selectively forming gate electrodes of second metal films on the first metal film on the channel active layer; and performing ion implantation using the gate electrodes as masks to form source/drain regions.

DETAILED DESCRIPTION OF THE PREFERRED EMBODIMENTS

A GaAs MESFET according to an embodiment of the present invention will be described hereinafter with reference to the accompanying drawings.

Since a channel active layer of a GaAs MESFET has a small thickness of 100 nm or less, a change in thickness of the layer directly influences a threshold voltage Vth. Since a dynamic range (a voltage difference between high and low levels, i.e., a logic amplitude) in a digital circuit of the GaAs MESFET is small, a variation in threshold voltage Vth between elements is required to fall within an extremely small allowance of ±(50 to 100) mV. In order to sufficiently satisfy this reqirement with high controllability, it is primarily very important that the distribution of impurity concentration in the channel active layer and its thickness must always be uniform. A recent crystal growth technique employing molecular beam epitaxy (to be referred to as MBE), metalorganic molecular beam epitaxy (to be referred to as MO-MBE), or metalorganic chemical vapor deposition (to be referred to as MO-CVD) is often called as a technique wherein atomic or molecular layers are stacked one by one. In a crystal growth technique for controlling a film thickness at an atomic level in the present invention, the above method is employed. This technique can control the film thickness in units of several atomic layers or less, and can confirm the thickness by growth rate measurement, or the like.

Figure 1A:
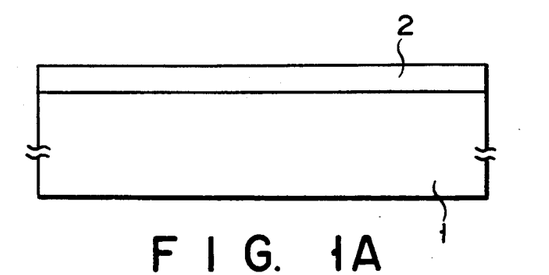
FIGS. 1(A) to 1(F) are sectional views showing steps in manufacturing MESFETs according to an embodiment of the present invention.

First, an n-type GaAs epitaxial layer 2 having a thickness of 100 nm or less is formed on a semi-insulating GaAs substrate 1 having a resistivity of $10^7$ ($\Omega$.cm) or more, using a crystal growth apparatus which employs MBE, MO-MBE, or MO-CVD, by a technique wherein atomic layers are stacked one by one. A donor concentration is determined in accordance with the thickness of the n-type GaAs epitaxial layer 2 and a target value of the threshold voltage Vth. However, the donor concentration is generally set within the range of $10^{15}$ to $10^{18}$ atoms/cm$^2$ (FIG. 1(A)).

Figure 1B:
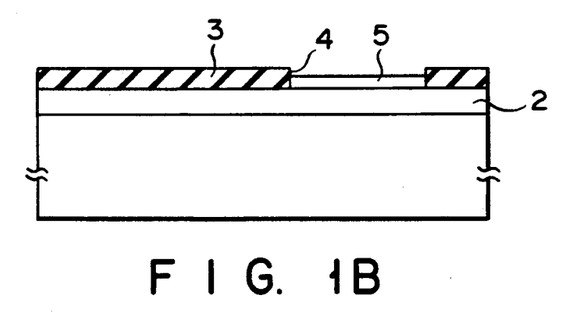

Then, an epitaxial layer 5 having an atomic layer level is deposited on only a predetermined portion of the n-type GaAs epitaxial layer 2 using the above-mentioned crystal growth apparatus and the crystal growth technique. For example, as shown in FIG. 1(B), a selective epitaxial layer growth method may be employed to deposit an insulating film 3 of SiO$_2$, SiN, SiON, or the like, on the epitaxial layer 2, an opening 4 is formed on the predetermined portion, and selectively deposit the epitaxial layer 5 in the opening 4. Thereafter, the insulating film 3 is entirely removed. Since the thickness of the deposited epitaxial layer is increased, a channel active layer having a threshold voltage Vth shifted to a negative side is formed.

Figure 1C:
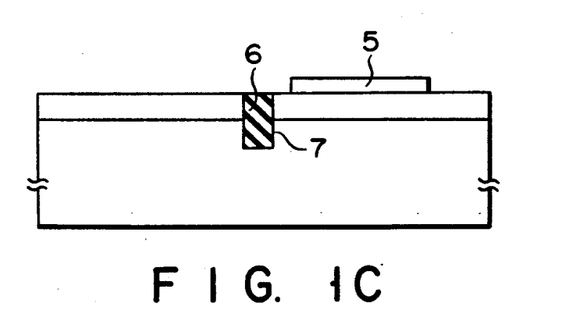

In the case of a GaAs IC, the step of isolating MESFETs is required. Therefore, as shown in FIG. 1(C), the step of etching the GaAs substrate by about 0.2 to 0.5 μm deep may be provided and an isolation trench 6 is formed. If necessary, an insulating material 7 may be buried in the isolation trench 6.

Figure 1D:
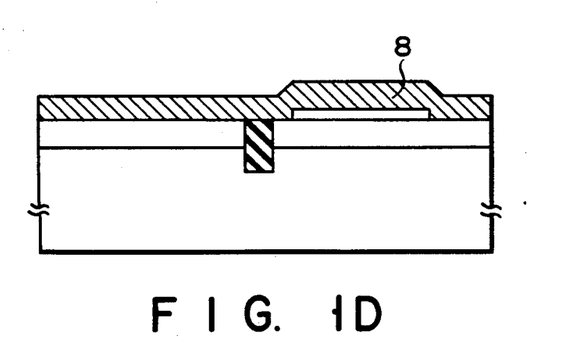

Then, a refractory metal or refractory metal compound 8 such as tungsten silicide (WSi) or tungsten nitride (WN) is deposited as a gate electrode by sputtering, CVD, or the like (FIG. 1(D)).

Figure 1E:
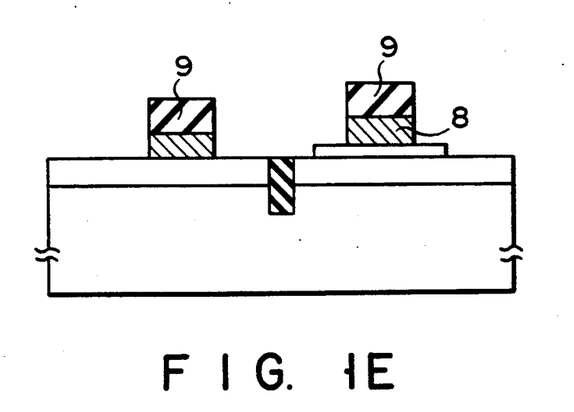

An insulating film 9 such as a silicon nitride film or silicon oxide film is deposited by, e.g., plasma CVD or CVD, and a gate electrode is formed by RIE (Reactive Ion Etching) (FIG. 1(E)). Si ions are implanted in the substrate 1 to form self-aligned n$^+$-type layers 10 for prospective source and drain regions by using the gate electrode 8 as a mask. Then, cap annealing using phosphosilicate glass (PSG) or the like, or capless annealing in an arsine atmosphere is performed to activate the n$^+$-type layers 10 (FIG. 1(F)).

Figure 1F:
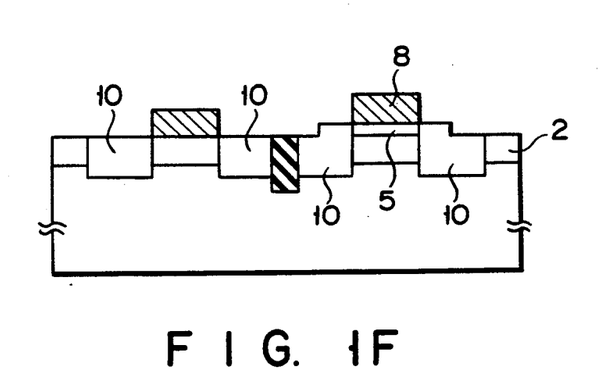

Thereafter, an Au-Ge ohmic metal which achieves an ohmic contact with the n$^+$-type layers 10 serving as the source and drain is deposited by a well known method to form source and drain electrodes. Then, a wiring operation is performed, and an integrated circuit device of the GaAs MESFET is thus manufactured.

Figure 2:
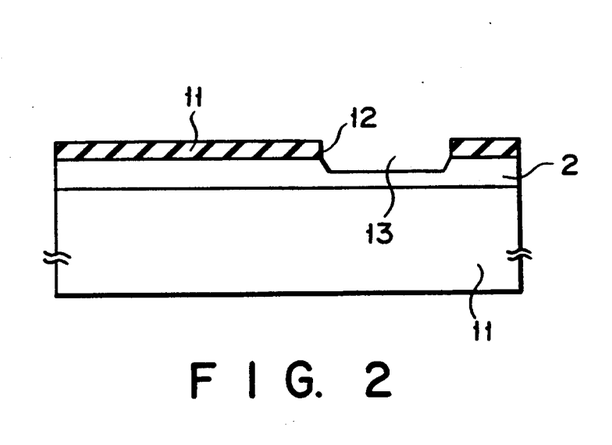
FIG. 2 and FIGS. 3(A) to 3(F) are sectional views showing steps in manufacturing MESFETs according to another embodiment.

FIG. 2 shows another embodiment of the present invention.

In FIG. 2, as a method of manufacturing MESFETs having different threshold voltages Vth, an insulating film 11 of SiO$_2$, SiN, SiON, or the like is deposited on an n-type epitaxial layer 2. An opening 12 is formed in a predetermined portion to form an etched portion 13 in the epitaxial layer 2, thus controlling the threshold voltage Vth. A channel active layer having a threshold voltage Vth shifted to a positive side is formed.

The following steps are the same as those in the first embodiment, and an integrated circuit device of GaAs MESFETs is thus manufactured.

According to the present invention, an excellent controllability of threshold voltage which cannot be obtained in channel layer formation by conventional ion implantation can be achieved. A MESFET having an epitaxial active layer according to the present invention has excellent controllability of impurities or crystal state in the channel active layer. Therefore, high controllability of the threshold voltage as a characteristic of the MESFET can be achieved. At the same time, the uniformity of the threshold voltage in a substrate is sufficiently assured. This is a necessary condition to realize a larger integrated circuit with a high production yield and excellent reproducibility.

Utilizing the present invention, the following GaAs integrated circuit devices can be easily realized. For example, in order to provide a high-output MESFET for an output buffer, with a large transconductance, a MESFET having a varied threshold voltage can be used. Or, in order to realize a high integration and low power consumption, a GaAs integrated circuit device mounted thereon with a basic logic comprising E (enhancement) type and D (depletion) type MESFETs for example DCFL (Direct Coupled FET Logic) can be easily manufactured.

A still another embodiment of the present invention will be described below with reference to FIGS. 3(A) to 3(F). In this embodiment, a technique for forming a channel active layer by a crystal growth method such as MBE, MO-MBE, or MO-CVD for controlling crystal growth at an atomic layer level in the same manner as in the above embodiments is employed as a basic technique. In addition, ions are implanted in the channel active layer to form another channel active layer having a uniform impurity concentration and a uniform film thickness.

FIGS. 3(A) to 3(F) are sectional views of elements showing steps in manufacturing GaAs MESFETs according to this embodiment. First, an n-type GaAs epitaxial layer 22 having a thickness of 1,000 Å or less is formed on a semi-insulating GaAs substrate 21 having a resistivity of $10^7$ ($\Omega$.cm) or more using a crystal growth apparatus employing MBE, MO-MBE, or MO-CVD by a technique for depositing atomic layers one by one. The donor concentration is determined in accordance with the thickness of the n-type GaAs epitaxial layer 22 and the target value of threshold voltage Vth, and is generally set within the range of $10^{15}$ to $10^{18}$ atom/cm² (FIG. 3(A)).

Figure 3A:
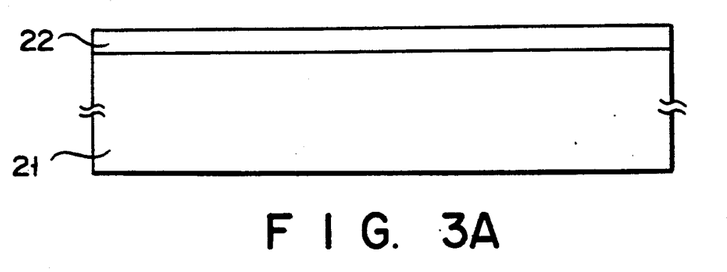
Figure 3B:
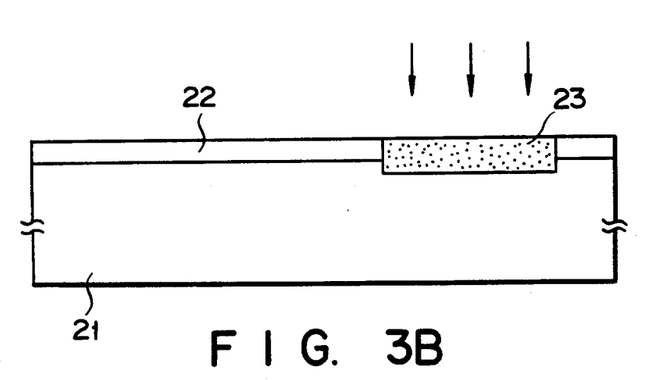

Subsequently, ions are implanted in only the n-type GaAs epitaxial layer 22, or in both the n-type GaAs epitaxial layer 22 and the GaAs substrate 21 to form an ion-implanted layer 23 (FIG. 3(B)). At this time, when Si ions are implanted, the impurity concentration is increased, and the threshold voltage Vth is set at a deeper level (shifted to the negative side). On the other hand, Zn or B ions are implanted, n-type impurity compensation is performed, and the concentration is decreased. Therefore, the threshold voltage Vth is set at a shallow level. For example, when a DCFL which is a basic logic of GaAs is formed, a shallow, lightly-doped E MESFET which is difficult to manufacture is controlled by the n-type GaAs epitaxial layer at an atomic layer level. Then, Si ions are implanted in a D MESFET, the concentration of the channel active layer is partially increased, and the threshold voltage Vth may be set at a shallow level (FIG. 3(B)). If necessary, capless annealing is performed in an arsine atmosphere to activate the ion-implanted layer.

Figure 3C:
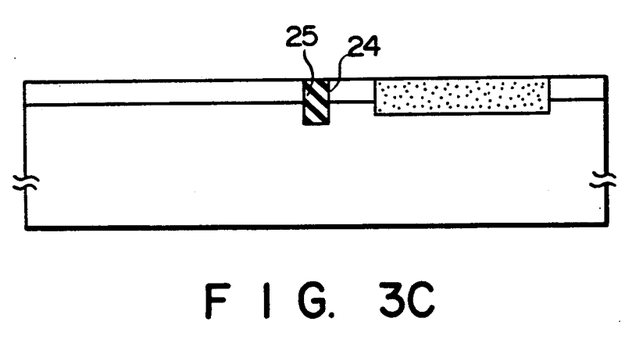

When a GaAs IC is manufactured, the step of isolating MESFETs is required. Therefore, the step of etching a GaAs substrate by about 0.2 to 0.5 $\mu$m deep is provided, and an isolation trench 24 may be formed, as shown in FIG. 3(C). If necessary, an insulating material 25 may be buried in the isolation trench 24.

Figure 3D:
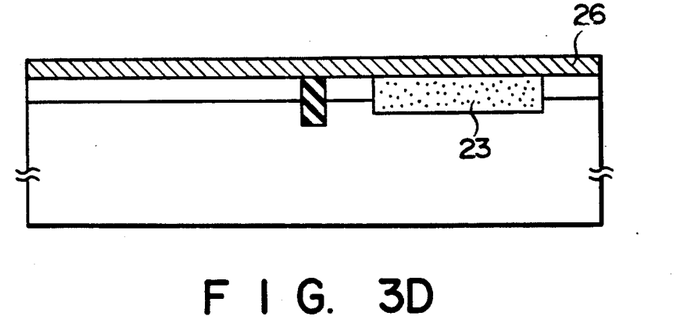

Then, a refractory metal compound 26 such as tungsten silicide (WSi) or tungsten nitride (WN) is deposited as a gate electrode by sputtering, CVD, or the like (FIG. 3(D)).

Figure 3E:
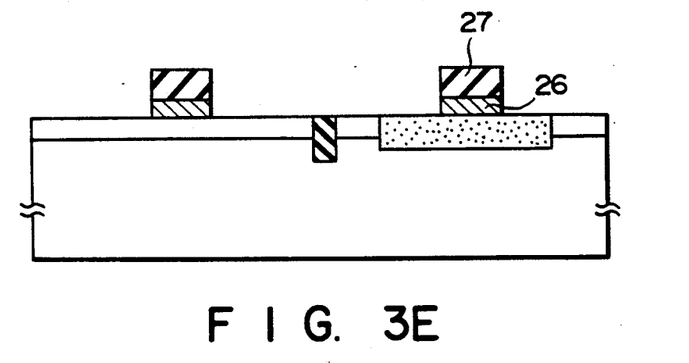
Figure 3F:
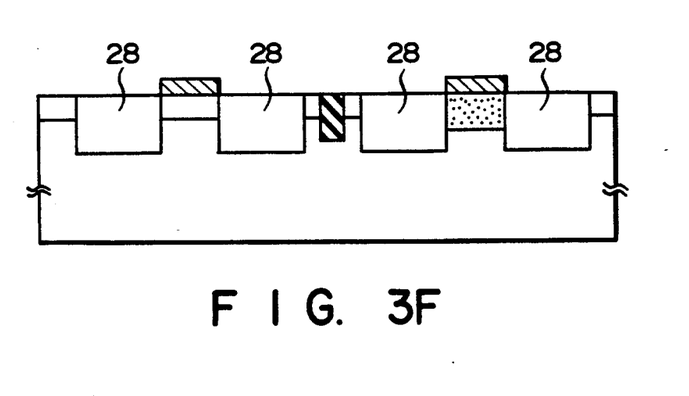

An insulating film 27 such as a silicon nitride film or silicon oxide film is deposited by, e.g., plasma CVD or CVD, and gate electrodes are formed by RIE (FIG. 3(E)). Si ions are implanted in the substrate 1 to form self-aligned n+-type layers 28 for prospective source and drain regions by using the gate electrodes 26 as masks. Then, cap annealing using PSG or the like, or capless annealing in an arsine atmosphere is performed to activate the n+-type layers 28 (FIG. 3(F)).

Figure 4:
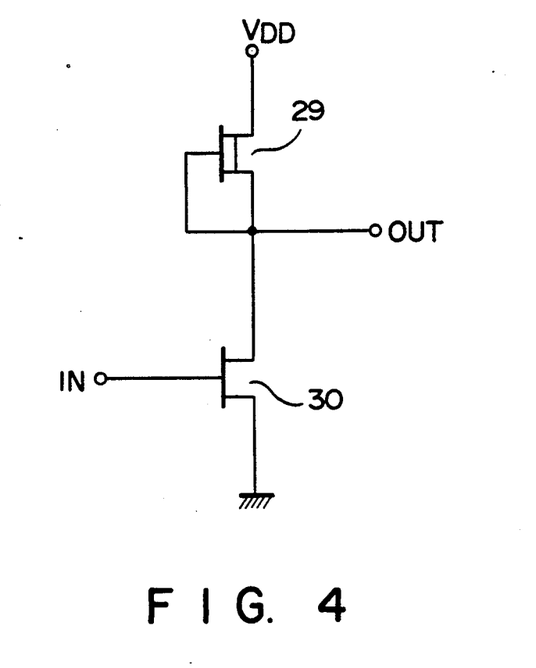
FIG. 4 is a circuit diagram of a basic logic circuit which employs the present invention and FIGS. 5(A) to 5(E) are sectional views showing steps in manufacturing MESFETs according to still another embodiment of the present invention.

Thereafter, an Au-Ge ohmic metal which achieves an ohmic contact with the n+-type layers 28 serving as the source and drain is deposited by a well known method to form source and drain electrodes. Then, a wiring processing is performed, and an integrated circuit device of the GaAs MESFETs is finally manufactured. These two types of GaAs MESFETs constitute a DCFL circuit shown in FIG. 4. Reference numeral 29 denotes a D MESFET; and 30, an E MESFET.

FIGS. 5(A) to 5(E) show still another embodiment of the present invention. An n-type GaAs epitaxial layer 32 is formed on a GaAs semi-insulating substrate 31, and an element isolation trench 33 is formed. These steps are the same as in those in the above embodiments.

Then, a first metal film 34 having a thickness of 1,000 Å or less is continuously deposited on the entire surface of the epitaxial layer 32 using a crystal growth apparatus. A refractory metal compound such as tungsten silicide ($WSi_x$) or tungsten nitride ($WN_x$) is used as the metal film. A part of the first metal film 34 serves as a Schottky gate electrode in the subsequent process. Ions are implanted through the metal film 34 to form another channel active layer region 35 (FIG. 5(A)).

In the MESFET, a signal response delay occurs in proportion to a product of the sheet resistance of a gate electrode and a gate electrode capacitance. For example, the resistivity of $WSi_x$ or $WN_x$ of a gate electrode material is 100 to 200 $\mu\Omega$.cm. When higher-speed operation is required, the above-mentioned delay is not negligible. In particular, when the gate width is increased to obtain a large amount of current, a delay and the gate electrode capacitance are increased, and an operation speed is reduced. Then, a second metal film 36 having a thickness of 1,000 Å or more is formed on the first metal film 34, and an insulating film 37 is formed thereon. As the insulating film 37, e.g., a silicon nitride film formed by plasma CVD or a silicon oxide film formed by CVD may be used. A refractory metal such as W, Mo, or Ti is used as the second metal film 36. When the next gate electrode is formed by RIE, selectivity between the first and second metal films 34 and 36 is preferably large (FIG. 5(B)).

Figure 5A:
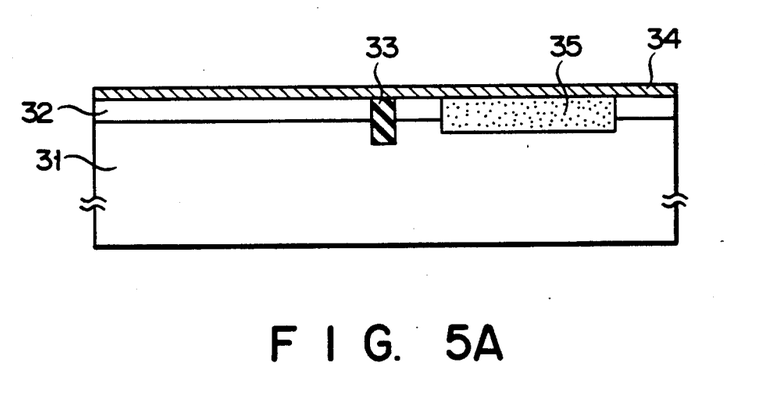
Figure 5B:
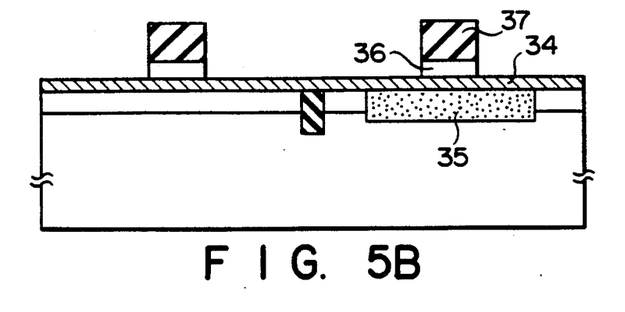
Figure 5C:
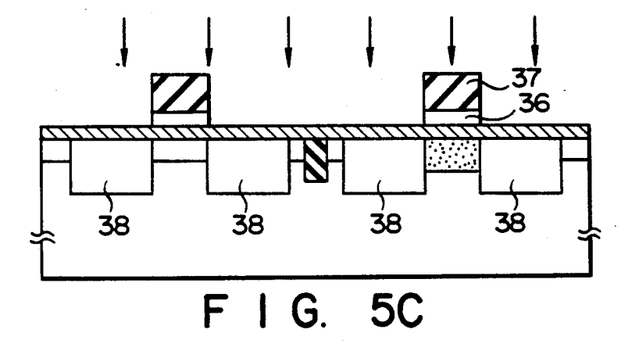

First, the insulating film 37 on the gate electrode is left as it is and the insulating film on the portion except the gate electrode is etched by RIE. After a resist is removed, an RIE gas is changed, and the gate electrode is formed by the second metal film 36 using the insulating film 37 as a mask. As shown in FIG. 5(C), ions are implanted in heavily-doped prospective source and drain formation regions 38 using a multi-layered film consisting of the second metal film 36 and the insulating film 37 as a mask. Then, n+-type heavily-doped layers 38 for prospective source and drain are self-aligned with the gate electrode. That allows an increase in transconductance gm, and high-speed operation can be further effectively realized.

Figure 5D:
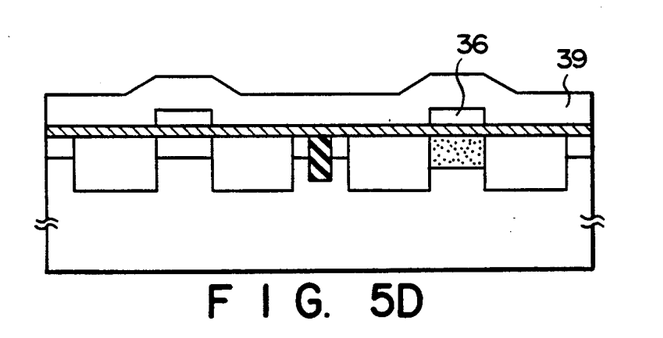
Figure 5E:
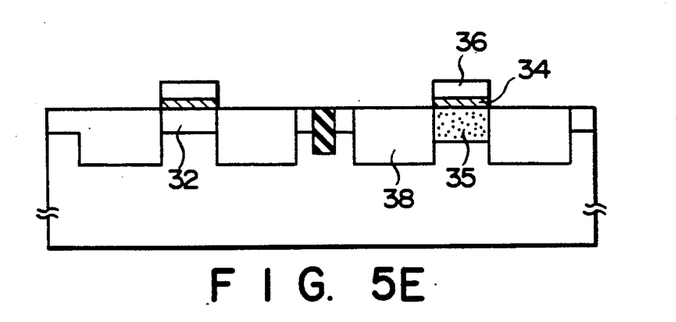

After the insulating film 37 on the gate electrode 36 is removed, in order to activate the channel active layer or prospective source and drain n+-type layers 38 by ion implantation, e.g., a silicon dioxide film containing phosphorus for preventing As ion removal, a silicon dioxide film containing arsenic, a silicon dioxide film containing both phosphorus and arsenic, or silicon nitride film not containing phosphorus or arsenic is deposited on the metal film as a protective film 39, and annealing, i.e., so-called cap annealing is performed (FIG. 5(D)).

In the above-mentioned activation annealing process in the manufacturing method according to the present invention, capless annealing process using a dangerous arsine gas is not employed, but cap annealing process using a metal film as a protective film is employed.

Then, the protective film such as silicon dioxide film or silicon nitride film used as a cap is removed. In addition, gate electrodes are formed by the first metal film 34 using the second metal film 36 as a mask by RIE (FIG. 5(E)).

The following steps are the same as those in the above embodiments of the present invention, and GaAs MESFETs are formed.

As described above, according to the present invention, the threshold voltage Vth of the MESFET formed in the epitaxial active layer has high controllability, as a matter of course. When ions are implanted in the epitaxial active layer, the controllability of the threshold voltage Vth of MESFET becomes more excellent as compared with the conventional case wherein only ion implantation is performed. This high controllability of the threshold voltages Vth realizes the manufacture of various GaAs basic logic circuits. A high-output MESFET for an output buffer having a large gm (transconductance) and a negative threshold voltage (largely shifted in the negative direction) can be easily manufactured. On the other hand, a basic logic circuit such as a DCFL (Direct Coupled FET Logic) including both a D MESFET and an E MESFET to realize high integration and low power consumption can be easily realized, thus providing an excellent manufacturing technique of an LSI constituted by GaAs MESFETs.

Note that the present invention is not limited to the above embodiments, and various applications may be made. For example, in the present invention, two or more channel active layers having different concentrations may be formed on a single semiconductor substrate.

As has been described above, according to the present invention, the controllability of a threshold voltage which cannot be obtained in the conventional channel layer formation by only ion implantation, can be achieved. A MESFET having an epitaxial active layer according to the present invention has excellent controllability of an impurity and crystal state in the channel active layer. Therefore, there is provided a semiconductor device in which uniformity in a substrate is sufficiently assured in addition to good controllability of the threshold voltage as the characteristic of a MESFET, and a method of manufacturing the same.

What is claimed is:

1. A method of manufacturing a semiconductor device, comprising the steps of:
    forming a first epitaxial layer of a first conductivity type for forming at least one first channel active layer on a semi-insulating substrate by a crystal growth technique which is capable of controlling a film thickness at an atomic level; and
    selectively depositing a second epitaxial layer of said first conductivity type on a portion of said first epitaxial layer for forming at least one second channel active layer having a thickness greater than said first channel active layer by a crystal growth technique which is capable of controlling a film thickness at an atomic level.

2. A method of manufacturing a field effect transistor, comprising the steps of:
    forming a first epitaxial layer of a first conductivity type for forming at least one first channel active layer on a semi-insulating substrate by a crystal growth technique which is capable of controlling a film thickness at an atomic level;
    selectively depositing a second epitaxial layer of said first conductivity type on a portion of said first epitaxial layer for forming at least one second channel active layer having a thickness greater than said first channel active layer by a crystal growth technique which is capable of controlling a film thickness at an atomic level;
    forming an element isolation trench between said first channel active layer and second channel active layer;
    selectively forming a gate electrode on each of said first channel active layer and said second channel active layer; and
    performing ion implantation using said each gate electrode as a mask to form source/drain regions.

* * * * *

UNITED STATES PATENT AND TRADEMARK OFFICE
CERTIFICATE OF CORRECTION

PATENT NO. : 5,192,701
DATED : March 09, 1993
INVENTOR(S) : Hiroshi Iwasaki

It is certified that error appears in the above-identified patent and that said Letters Patent is hereby corrected as shown below:

Abstract, line 8, before "one another" insert --from--

Signed and Sealed this

Twelfth Day of April, 1994

Attest:

BRUCE LEHMAN

Attesting Officer

Commissioner of Patents and Trademarks